United States Patent
Bi et al.

(10) Patent No.: US 10,679,830 B2
(45) Date of Patent: Jun. 9, 2020

(54) CLEANING PROCESS FOR REMOVING BORON-CARBON RESIDUALS IN PROCESSING CHAMBER AT HIGH TEMPERATURE

(71) Applicant: Applied Materials, Inc., Santa Clara, CA (US)

(72) Inventors: Feng Bi, Cupertino, CA (US); Prashant Kumar Kulshreshtha, San Jose, CA (US); Kwangduk Douglas Lee, Redwood City, CA (US); Paul Connors, San Mateo, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 42 days.

(21) Appl. No.: 15/625,721

(22) Filed: Jun. 16, 2017

(65) Prior Publication Data

US 2017/0365450 A1 Dec. 21, 2017

Related U.S. Application Data

(60) Provisional application No. 62/352,223, filed on Jun. 20, 2016.

(51) Int. Cl.
*H01J 37/32* (2006.01)

(52) U.S. Cl.
CPC .. *H01J 37/32862* (2013.01); *H01J 37/32568* (2013.01); *H01J 37/32577* (2013.01)

(58) Field of Classification Search
None
See application file for complete search history.

(56) References Cited

U.S. PATENT DOCUMENTS

| | | |
|---|---|---|
| 9,299,581 B2 | 3/2016 | Lee et al. |
| 10,236,186 B2 | 3/2019 | Mohanty |
| 2012/0285481 A1 | 11/2012 | Lee et al. |
| 2014/0283872 A1 | 9/2014 | Deehan et al. |

(Continued)

FOREIGN PATENT DOCUMENTS

| | | | | |
|---|---|---|---|---|
| JP | 5442403 B2 | * | 3/2014 | ........... B08B 7/0035 |
| KR | 20090020925 A | | 2/2009 | |

OTHER PUBLICATIONS

International Search Report and Written Opinion of related application PCT/US2017/037946 dated Aug. 31, 2017.

*Primary Examiner* — Eric W Golightly
(74) *Attorney, Agent, or Firm* — Patterson + Sheridan, LLP

(57) ABSTRACT

Embodiments of the invention generally relate to methods for removing a boron-carbon layer from a surface of a processing chamber using water vapor plasma treatment. In one embodiment, a method for cleaning a surface of a processing chamber includes positioning the pedestal at a first distance from the showerhead, and exposing a deposited boron-carbon layer to a first plasma process where the first plasma process comprises generating a plasma that comprises water vapor and a first carrier gas by biasing a showerhead that is disposed over a pedestal, and positioning the pedestal at a second distance from the showerhead and exposing the deposited boron-carbon layer to a second plasma process where the second plasma process comprises generating a plasma that comprises water vapor and a second carrier gas by biasing the showerhead and biasing a side electrode relative to the showerhead.

25 Claims, 3 Drawing Sheets

(56) References Cited

U.S. PATENT DOCUMENTS

2015/0228463 A1     8/2015  Manna et al.
2015/0279693 A1 * 10/2015  Jongbloed ......... H01L 21/67017
                                                        134/19
2016/0203971 A1 *  7/2016  Tsiang ................ H01L 21/0217
                                                        257/640

* cited by examiner

CLEANING PROCESS FOR REMOVING BORON-CARBON RESIDUALS IN PROCESSING CHAMBER AT HIGH TEMPERATURE

CROSS-REFERENCE TO RELATED APPLICATIONS

This application claims benefit of U.S. provisional patent application Ser. No. 62/352,223, filed Jun. 20, 2016, which is hereby incorporated herein by reference.

FIELD

Embodiments described herein relate to methods of cleaning a processing chamber after forming a hardmask layer on a substrate. More particularly, to methods of cleaning the processing chamber that is adapted to form a boron-carbon containing high-temperature hardmask layer on a substrate.

BACKGROUND

To achieve higher circuit densities in most modern semiconductor devices the structural features formed in these semiconductor devices continue to shrink. With the lateral dimension scaling down much faster than the vertical dimension, high aspect ratio (HAR) structures are now prevalent in industry applications such as DRAM and vertical NAND. In modern semiconductor techniques, hardmasks are used for etching deep, high aspect ratio features that conventional photoresists cannot withstand. Among all the hardmask materials, boron-carbon films, such as a boron-carbon layer, have demonstrated superior patterning performance as compared to amorphous carbon when being used as an ashable hardmask during an etching process.

Recently developed boron-carbon films processed at high temperature (400° C. or higher) show even higher mass density and etch selectivity properties (3× the current best conventional hardmask film in market). However, boron-carbon films, especially deposited at high temperature, are not easily stripped or ashed. After depositing a high density hardmask layer on multiple substrates in a processing chamber, layers of unwanted material are deposited on various chamber components found within the processing chamber. These layers of unwanted material, which are also referred to herein as deposition residuals, accumulate on chamber components and surfaces of the processing chamber and eventually become a source of unwanted particles that will contaminate substrates that are subsequently processed in the processing chamber. To maintain the cleanliness of the processing chamber, a cleaning process has to be periodically performed after each or a number of substrates are processed in the processing chamber.

Conventional boron-doped carbon chamber cleaning processes have used remote plasma cleaning processes that have included fluorine-rich gaseous sources (e.g. $NF_3$, $CF_4$, $SF_6$ and $C_2F_6$) or chlorine-rich source ($Cl_2$, $BCl_3$, or $CCl_4$). However, for high temperature (T>400° C.) boron-carbon deposition processes such cleaning methods cannot be used, since the fluorine or chlorine containing cleaning gases will react with the aluminum (Al) containing heated chamber components found within the processing chamber. In one example, the surfaces of essential chamber components, such as the substrate heater, which is typically formed from aluminum nitride (AlN), can be rapidly etched due to the formation of aluminum fluoride ($AlF_3$) or aluminum chloride ($AlCl_3$) due to the fluorine-rich or chlorine-rich ambient conditions created during the chamber cleaning process. $AlF_3$ is known to form at much faster rates at higher temperatures. At temperatures greater than 500° C., $AlF_3$ sublimates and redeposits on chamber components and the chamber walls. The formation of $AlF_3$ and $AlCl_3$ during the cleaning process leads to Al/F/Cl contamination within the processing chamber and contributes to process drift over time and to unwanted particles during subsequent deposition processes performed in the processing chamber. Therefore, there is need for a new method of cleaning a processing chamber that selectively removes deposited boron-carbon layers from the various processing chamber components.

SUMMARY

Disclosed are methods and apparatus for removing a boron-carbon layer from a surface of a processing chamber. The method for removing a boron-carbon layer from a surface of a processing chamber includes exposing a deposited boron-carbon layer to a first plasma process and a second plasma process. The first plasma process comprises positioning a pedestal at a first distance from the showerhead and generating a plasma that comprises water vapor and a first carrier gas by biasing a showerhead that is disposed over the positioned pedestal. The deposited boron-carbon layer is then exposed to a second plasma process. The second plasma process includes positioning the pedestal at a second distance from the showerhead, generating a plasma that comprises water vapor and a second carrier gas by biasing the showerhead, and biasing a side electrode relative to the showerhead.

In one embodiment, the method for removing a boron-carbon layer from a surface of a processing chamber includes an optional additional plasma process step that includes exposing the deposited boron-carbon layer to a third plasma process, wherein the third plasma process comprises generating a plasma that essentially consists of oxygen and a third carrier gas and includes biasing a showerhead that is disposed over a pedestal.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the invention generally relate to a cleaning process for removing deposited boron-carbon containing layers from various chamber components found within a processing chamber using a plasma that contains water vapor.

Figure 1:
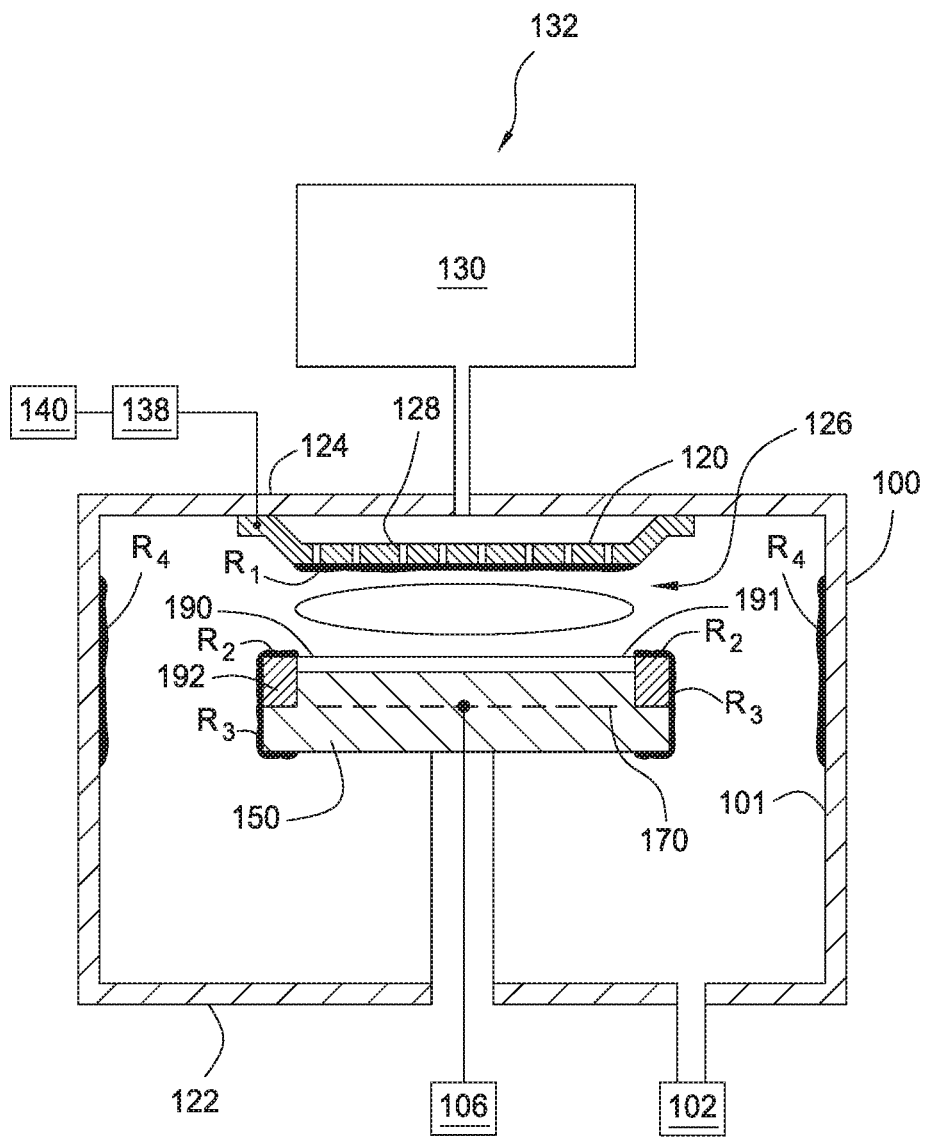
FIG. 1 depicts a schematic illustration of an apparatus that can be used to deposit a boron-carbon containing film.

FIG. 1 is a schematic representation of a typical substrate processing system 132 that can be used to perform the boron-carbon film deposition process and depicts the chamber regions and components that are subject to the build-up of deposited boron-carbon containing layers. The processing system 132 includes a process chamber 100 coupled to a gas panel 130. The process chamber 100 generally includes a top 124, chamber side walls 101 and a bottom wall 122 that collectively define an interior volume 126. A support pedestal 150 is provided in the interior volume 126 of the process chamber 100.

A vacuum pump 102 is coupled to a port formed in the bottom wall 122 of the process chamber 100. The vacuum pump 102 is used to maintain a desired gas pressure in the process chamber 100 during the boron-carbon layer deposition process and subsequent cleaning processes. The vacuum pump 102 generally evacuates the processing gases and by-products delivered to and/or formed in the interior volume 126 from the process chamber 100 during the boron-carbon layer deposition and post-deposition cleaning processes.

A showerhead 120 having a plurality of apertures 128 is coupled to the top 124 of the process chamber 100 above the pedestal 150. The apertures 128 of the showerhead 120 are utilized to introduce the deposition and cleaning process gases into the process chamber 100.

The showerhead 120 is connected to gas panel 130 that allows various gases to supply to the interior volume 126 during process. A plasma is formed from the process gas mixture exiting the showerhead 120 to enhance thermal decomposition of the process gases resulting in the deposition of material on surface 191 of substrate 190 or cleaning of the process chamber components.

The showerhead 120 and pedestal 150 form a pair of spaced apart electrodes in the interior volume 126. One or more RF sources 140 provide a bias potential through a matching network 138 to the showerhead 120 to facilitate generation of a plasma between the showerhead 120 and the pedestal 150. Shadow ring 192 surrounds the edge of substrate 190 and the upper side edge of pedestal 150. Pedestal 150 includes an embedded heater element 170 for controlling the temperature of substrate 190 supported on the pedestal 150. The pedestal 150 is resistively heated by applying an electric current from a power supply 106 to the heater element 170. The pedestal 150 may include an electrostatic chuck that is formed from aluminum nitride (AlN).

By operation of the high temperature plasma boron-carbon deposition process within the chamber, not only is a boron-carbon film deposited on substrate 190, but residual deposits of boron-carbon are also deposited on chamber components and the chamber walls as depicted by regions $R_1$, $R_2$, $R_3$ and $R_4$. The residual deposits found in region $R_1$ include the boron-carbon layers formed on the surface of showerhead 120 after depositing one or more boron-carbon containing layers on substrate 190. The residual deposits found in region $R_2$ include boron-carbon layers formed on the top surface of shadow ring 192. The residual deposits found in Region $R_3$ include boron-carbon film on found on the side and bottom surfaces of the shadow ring and on the side and bottom surfaces of pedestal 150 after performing multiple boron-carbon layer deposition processes. The residual deposits found in region $R_4$ include boron-carbon layers formed on the surfaces of the chamber side walls 101 after performing multiple boron-carbon layer deposition processes. Residual build-up of these unwanted boron-carbon film layers within the processing chamber can lead to particle contamination during subsequent substrate deposition processes.

In one embodiment, the deposited boron-carbon film layers may be boron-doped carbon material or a hydrogenated boron carbide material having an atomic ratio of boron to carbon of about 4:1 or less. In another embodiment, the deposited boron-carbon film layers may be amorphous carbon layers or carbon containing layers which contain boron with an atomic ratio of boron to carbon within a range of about 1:5 to about 4:1. In some embodiments, the deposited boron-carbon layer includes boron-doped carbonaceous layers, which include between 1 wt. % and 70 wt. % boron. As used herein, a boron-doped carbonaceous layer, or deposited boron-carbon layer, includes inorganic layers composed of at least 1 wt % boron and at least 20 wt % carbon. Included in this class of materials is boron-rich amorphous carbon, typically composed of greater than 25 wt % boron. Excluded from the "boron-doped carbonaceous" class of materials are organic materials having a total carbon content less than 20 wt %, such as those commonly employed as bottom anti-reflective coating (BARC) layers, which typically include polyamides and polysulfones and have less than 5 wt % carbon, even if such materials have an appreciable amount of boron although they typically do not incorporate any boron. An exemplary boron-doped amorphous carbon material is commercially available from Applied Materials, Inc., CA, U.S.A. under the trade name Advanced Patterning Film™ (APF), and more particularly a species of the APF genus of materials known as Saphira™ APF, which is boron doped.

Figure 2:
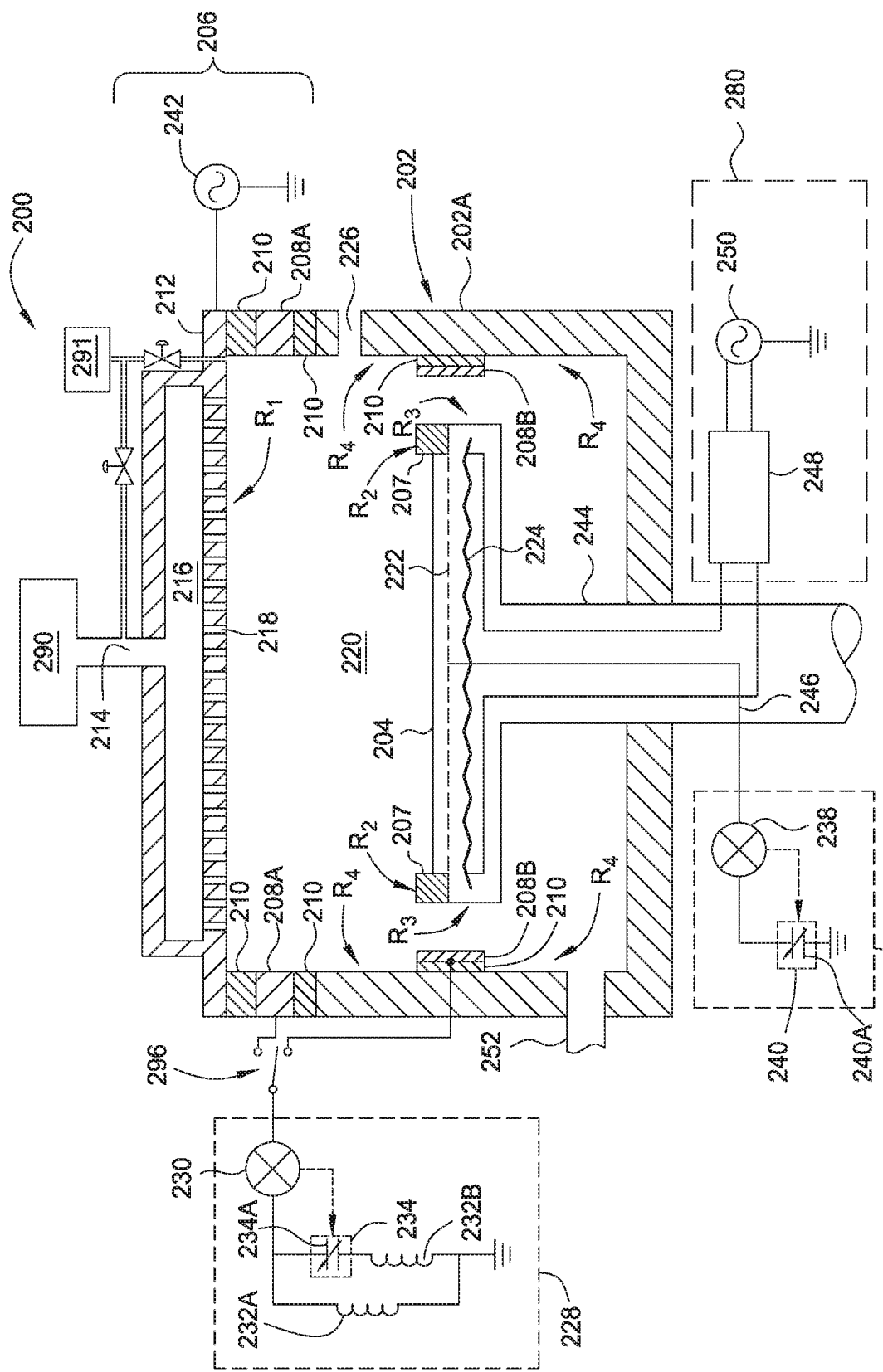
FIG. 2 depicts a schematic illustration of an apparatus that can be used for the practice one or more of the embodiments of the disclosure provided herein.

FIG. 2 is a schematic side view of an inventive apparatus, such as processing chamber 200, which may be used to practice the post-deposition chamber cleaning processes described herein. The processing chamber 200 features a chamber body 202, a pedestal 204 and a lid assembly 206. The lid assembly 206 is coupled to the chamber body 202. The chamber body 202 includes one or more chamber walls 202A that, in combination with the lid assembly 206, enclose the pedestal 204 and shadow ring 207 in a processing volume 220. Substrates are provided to the processing volume 220 through an opening 226 formed in one of the chamber walls 202A, which may be conventionally sealed for processing using a door.

A plasma profile modulator (PPM) electrode 208 may be disposed adjacent to the processing volume 220 and various chamber components, such as the chamber body 202 and pedestal 204. In some configurations, the profile modulator (PPM) electrode 208 is disposed between a chamber wall 202A and the lid assembly 206, as illustrated by profile modulator (PPM) electrode 208A in FIG. 2. In some configurations, the PPM electrode 208 may be disposed in a position that is adjacent to the chamber walls 202A and side of the pedestal 204, as illustrated by profile modulator (PPM) electrode 208B in FIG. 2. In some configurations, the PPM electrode 208 is formed within the lid assembly 206 (not shown). In some configurations, the PPM electrode 208 may be an annular, or a ring-like member, that forms a ring electrode when biased relative to the showerhead 212 by the tuning circuit 228. The PPM electrode 208 may be a continuous loop around a circumference of the processing chamber 200 surrounding the processing volume 220, or may be discontinuous at selected locations if desired. The PPM electrode 208 may also be a perforated electrode, such as a perforated ring or a mesh electrode. The PPM electrode 208 may also be a plate electrode, for example a secondary showerhead (not shown) that is positioned adjacent to the showerhead 212.

In one configuration, an isolator 210, which may be a dielectric material such as a ceramic or metal oxide, for example aluminum oxide and/or aluminum nitride, contacts the PPM electrode 208 and separates the PPM electrode 208 electrically and thermally from the showerhead 212 and/or chamber walls 202A of the chamber body 202. The showerhead 212 features openings 218 for admitting process gas delivered from a gas source 290 into the processing volume 220. The showerhead 212 may be coupled to a source of electric power 242, such as an RF generator. The source of electric power 242 may provide RF power, DC power, pulsed DC power, and/or pulsed RF.

The showerhead 212 may be made of conductive and/or non-conductive components. For example, a body of the showerhead 212 may be conductive while a face plate of the showerhead 212 is non-conductive. In a plasma processing chamber, the showerhead 212 may be powered, as shown in FIG. 2, or the showerhead 212 may be coupled to ground.

The PPM electrode 208, which may include the PPM electrode 208A and/or PPM electrode 208B, may be coupled through switch 296 to a tuning circuit 228 that controls a ground pathway of the processing chamber 200. The tuning circuit 228 comprises an electronic sensor 230 and an electronic controller 234, which may include a variable capacitor 234A. The tuning circuit 228 may be an LLC circuit comprising one or more inductors 232. The tuning circuit 228 may be any circuit that features a variable or controllable impedance under the plasma conditions present in the processing volume 220 during processing. In the embodiment illustrated in FIG. 2, the tuning circuit 228 features a first inductor 232A in series with the electronic controller 234 and a second inductor 232B in parallel with the electronic controller 234. The electronic sensor 230 may be a voltage or current sensor, and may be coupled to the electronic controller 234 to afford a degree of closed-loop control of plasma conditions inside the processing volume 220.

A bottom tuning electrode 222 may be coupled to the pedestal 204. The bottom tuning electrode 222 may be embedded within the pedestal 204, as shown, or coupled to a surface of the pedestal 204. The bottom tuning electrode 222 may be a plate, a perforated plate, a mesh, a wire screen, or any other distributed arrangement. The bottom tuning electrode 222 may be coupled to a second tuning circuit 236 by a conduit 246, for example a cable having a selected impedance such as 50Ω, disposed in a shaft 244 of the pedestal 204. The second tuning circuit 236 may have a second electronic sensor 238 and a second electronic controller 240, which may include a second variable capacitor 240A. The second electronic sensor 238 may be a voltage or current sensor, and may be coupled to the second electronic controller 240 to provide further control over plasma conditions in the processing volume 220.

A pedestal electrode 224, which may be a biasing electrode and/or an electrostatic chucking electrode, may also be coupled to the pedestal 204 in addition to the bottom tuning electrode discussed above. The pedestal electrode 224 may be coupled to a pedestal power supply assembly 280. The pedestal power supply assembly 280 includes a source of electric power 250 and a filter 248, which may be an impedance matching circuit. The source of electric power 250 may provide DC power, pulsed DC power, RF power, pulsed RF power, or a combination thereof.

The lid assembly 206 and pedestal 204 of FIG. 2 may be used with any processing chamber for plasma or thermal processing. One example of a plasma processing chamber with which the lid assembly 206 and pedestal 204 may be beneficially used is the PRODUCER® platform and the Producer XP Precision CVD chamber, Producer® SE chamber or Producer® GT chamber available from Applied Materials, Inc., located in Santa Clara, Calif. It is contemplated that other chambers, including those produced by other manufacturers, may benefit from embodiments described herein.

A water vapor generating (WVG) system 291 is coupled to the processing chamber 200 that is in fluid communication to the interior processing volume 220 defined within processing chamber 200. The WVG system 291 generates ultra-high purity water vapor by means of flowing pure deionized water through a liquid evaporator. The liquid evaporator includes heating units to vaporize the water at high flow rates of up to 40 SLM or even greater. Alternatively, the WVG system may also generate water vapor by the catalytic reaction of $O_2$ and $H_2$. In one embodiment, the $H_2$ and the $O_2$ each flow into the WVG system at a rate in the range from about 1 SLM to about 100 SLM at a temperature of about 110° C. to about 120° C. In one embodiment, an $O_2$ enriched water vapor is provided by flowing $O_2$ at higher stoichiometric flow rate than the flow of $H_2$ to form an $O_2$ rich water vapor. In one embodiment, an $H_2$ enriched water vapor is provided by flowing $H_2$ at higher stoichiometric flow rate than the flow of $O_2$ to form an $H_2$ rich water vapor. Once a desired $H_2/O_2$ concentration is determined, each flow rate may be proportionately altered to adjust the outward flowing water vapor with a desired $H_2/O_2$ concentration in the water vapor. Heated gas lines and a heated input manifold in the lid assembly may also be integrated into the associated water vapor delivery system and heated to 120° C. to avoid water vapor condensation in the lines. Temperature control of the WVG system may also include a feedback loop/control system that is coupled to the input manifold, gas lines and chamber, and is configured to generate the water vapor and prevent condensation of the generated water vapor that is delivered to the process chamber.

In one embodiment, the WVG system has a catalyst-lined reactor or a catalyst cartridge in which water vapor is generated by means of a chemical reaction. The catalyst may include a metal or alloy, such as palladium, platinum, nickel, combinations thereof and alloys thereof. The ultra-high purity water is ideal for a cleaning process to eliminate undesired contamination. In one embodiment, to prevent unreacted $H_2$ from flowing into the processing volume 220, $O_2$ is allowed to flow through the WVG system for 5 seconds. Next, $H_2$ is allowed to enter the reactor for about 5 seconds. The catalytic reaction between $H_2$ and $O_2$ is instantaneous, so water vapor is generated immediately after the $H_2$ and $O_2$ reach the reactor. Regulating the flow of $H_2$ and $O_2$ allows the concentration to be precisely controlled at any point from 1% to 100% concentrations, that is, the water vapor may contain water, $H_2$, $O_2$ or combinations thereof. In one example, the water vapor contains water and $O_2$. In another example, the water vapor contains water and $H_2$. Similarly, by employing the same method of gas flow control, the amount of water vapor may also be regulated, yielding accurate and repeatable flows every time. While water vapor is usually generated by flowing $H_2$ and $O_2$ into the reactor, the $O_2$ may be supplemented or substituted with another oxygen source compound, such as NO, $N_2O$, $NO_2$, $N_2O_5$, $H_2O_2$ or $O_3$. In one embodiment, $H_2$ and $N_2O$ are utilized to form a water vapor as needed. Suitable WVG systems are commercially available, such as the WVG by Fujikin of America, Inc., located in Santa Clara, Calif., and the CSGS (Catalyst Steam Generator System) by Ultra Clean Technology, located in Menlo Park, Calif. It is noted that the WVG system may also be any kind of equipment that capable to generate water vapor in any concentration. However, to etch the high temperature boron-carbon film layers that are disposed on the various chamber components at high rates, the WVG system needs to deliver a high water vapor flow rate to the processing chamber, such as a flow rate of greater than 10 SLM.

In operation, the processing chamber 200 affords real-time control of plasma conditions in the processing volume 220. Process gases are flowed through the lid assembly 206 from the gas source 290 through a gas inlet 214. The deposition process gases for depositing a boron-carbon hardmask layer may be any suitable CVD precursor mixture, such as a mixture containing a carbon containing gas, such as, but not limited to, methane ($CH_4$), propylene ($C_3H_6$), propyne ($C_3H_4$), propane ($C_3H_8$), butane ($C_4H_{10}$), butylenes ($C_4H_8$), butadiene ($C_4H_6$), acetelyne ($C_2H_2$), toluene ($C_7H_8$ ($C_6H_5CH_3$)) and mixtures thereof, and a boron containing gas, such as, but not limited to, diborane ($B_2H_6$). Chamber clean gases include the water vapor described above in combination with an inert carrier gas such as Ar or He to suppress condensation. It is believed that the adding of some inert gases such as Ar/He can also increase the etch rate. It has been found that small amounts of $H_2$ may also be added to the water vapor to increase the etch rate.

During processing, the delivered process gases exit the processing chamber 200 through an outlet 252, which is connected to a pump (not shown), and electric power is provided to the showerhead 212 to establish a plasma in the processing volume 220. The formation of a plasma that contains desired deposition related process gases is performed during the boron-carbon layer deposition process and also the formation of a plasma that contains cleaning related process gases (e.g., at least one of water vapor, an inert gas, oxygen and hydrogen) is performed during a subsequent chamber clean processes, as discussed further below. An electrical bias is formed on the pedestal 204, during boron-carbon film deposition process to enhance the deposition rate on the wafer. During chamber clean processes, the pedestal's bottom tuning electrode 222 may be subjected to an electrical bias to control the plasma density and enhance the plasma profile so the plasma reaches regions $R_2$, $R_3$ and $R_4$ and etches the boron-carbon layers from the shadow ring, pedestal edge and bottom and the chamber walls. Upon generating a plasma in the processing volume 220, a potential difference may be established between the plasma and the PPM electrode 208A and/or a potential difference may be established between the plasma and the bottom tuning electrode 222. The PPM electrode 208 and bottom tuning electrode 222 need not be biased at all times but may be used and controlled as required for both boron-carbon film deposition processes and for chamber cleaning processes described herein. The electronic controllers 234 and 240 may be used to adjust the properties of the ground paths generated through the PPM electrode 208A and the bottom tuning electrode 222, as represented by the two tuning circuits, a first tuning circuit 228 and a second tuning circuit 236. A set point may be delivered to the first tuning circuit 228 and the second tuning circuit 236 to provide independent control of the plasma density and/or plasma density uniformity from center to edge during processing in the processing chamber. In embodiments where the electronic controllers are both variable capacitors, the electronic sensors may adjust the variable capacitors to minimize plasma non-uniformity during processing.

Each of the tuning circuits, first tuning circuit 228 and second tuning circuit 236 have variable impedance that may be adjusted using the respective electronic controllers 234 and 240. Where the electronic controllers 234 and 240 may include variable capacitors 234A, 240A, the capacitance range of each of the variable capacitors, and the inductances of the inductors 232A and 232B, are chosen to provide an impedance range, depending on the frequency and voltage characteristics of the plasma, that has a minimum in the capacitance range of each variable capacitor. Thus, when the adjusted impedance of the first tuning circuit 228 is high, the resulting plasma that is formed in the processing volume has a shape that has a minimum coverage over the surface of the pedestal. When the impedance of the first tuning circuit 228 is low, the coverage of the plasma over the surface of the pedestal, or area coverage, grows to a maximum. In some embodiments, a low impedance in the tuning circuit 228 is used to assure that the formed plasma effectively covers the entire working area of the pedestal 204 providing uniform deposition of the boron-carbon film across the substrate and uniform etching of the showerhead during the cleaning process. As the electronic controller 234 causes an impedance in the tuning circuit to be increased from a minimum value, the plasma shape shrinks from extending to the chamber walls and thus the areal coverage of the pedestal declines. The electronic controller 240 has a similar effect, increasing and decreasing areal coverage of the plasma over the pedestal as the capacitance value(s) within the electronic controller 240 are adjusted. Controlling the shape of the plasma is useful to assure that a desirable deposition rate and uniformity of the deposited boron-carbon film is achieved. However, the maximum areal coverage of the plasma leaves unwanted boron-carbon film on the showerhead, shadow ring, sides of the pedestal and chamber walls as shown as regions $R_1$-$R_4$ in FIG. 1. In one embodiment, during the chamber cleaning operation described herein, electronic controllers 234 and 240 are used to maximize the areal coverage expanding the cleaning plasma profile to clean the same showerhead, shadow ring, sides of the pedestal and the chamber walls.

The electronic sensors 230 and 238 may be used to assist with the tuning of respective circuits 228 and 236 in a closed loop. A set point for current or voltage, depending on the type of sensor used, may be installed in each sensor. Electronic controller 234 and 240 may be provided with control software that determines an adjustment to minimize deviation from the set point. In this way, a plasma shape can be selected and dynamically controlled during processing to effectively direct the plasma to more effectively etch the boron-carbon layers in regions $R_1$, $R_2$, $R_3$ and $R_4$. It should be noted that, while the foregoing discussion is based on electronic controllers 234 and 240 that may include variable capacitors 234A, 240A, any electronic component (e.g., variable inductors) with adjustable characteristic may be used to provide tuning circuits 228 and 236 with adjustable impedance.

Figure 3:
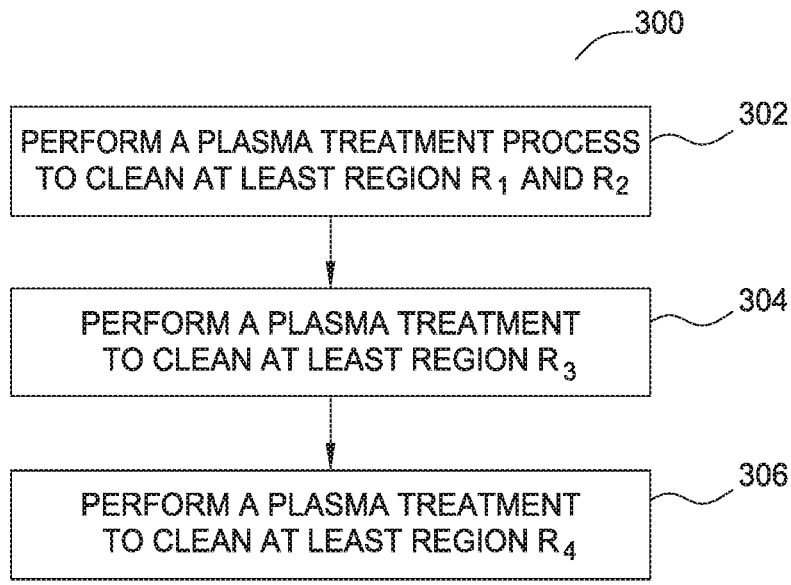
FIG. 3 depicts a flow process diagram of a cleaning process according to one embodiment of the present invention.

FIG. 3 is a flow diagram 300 illustrating a method of removing a boron-carbon film using plasma generated from water vapor according to one embodiment of the invention. Flow diagram 300 includes operations 302, 304, and 306 which will be discussed in relation to the deposits illustrated in process chamber 100 as shown in FIG. 1 and processing chamber hardware found in processing chamber 200 as shown in FIG. 2.

During operations 302, 304 and 306, the boron-carbon residual layer found in regions $R_1$, $R_2$, $R_3$ and $R_4$, as shown in FIG. 1, are removed by performing a water vapor plasma treatment process using the hardware found in processing chamber 200. The water vapor generated in the plasma treatment process may form an oxidizer (O.), a reducer (H.), and hydroxyl groups (OH) that are used to remove the deposited boron-carbon layers from the chamber components. It is believed that oxygen oxidizer can react with the carbon element from the boron-carbon layer to form a volatile compound (e.g. CO, $CO_2$) which may be exhausted from the chamber while the hydrogen reducer may react with the boron, if any, in the boron-carbon residual regions $R_1$, $R_2$ and $R_3$ to form a volatile compound (e.g., $BH_3$, $B_2H_6$ additionally $B_2O_3$ can be formed which can react to form volatile products later etc.) which is then exhausted from the chamber. It is believed that helium/argon gas, which is used as a carrier gas, increases the etch uniformity of the chamber cleaning process when using a water vapor plasma. The Ar/He carrier gas may also be combined with additional carrier gases such as H2 at various flow rates which are found to enhance the etch rate of the boron-carbon films.

In operation, several process parameters, such as water vapor flow rate, RF power levels, chamber pressure and spacing between the showerhead and pedestal may also be controlled to control etch rate. In one example, the water vapor may be generated and supplied into the process chamber in either a continuous mode or in a pulsed mode. In one embodiment, the water vapor may be generated in a continuous mode into the process chamber at a flow rate between about 1 SLM and 40 SLM. RF power may be supplied into the process chamber between about 1000 Watts and about 5000 Watts to dissociate the water vapor for reaction. The chamber process may be controlled at less than about 760 Torr, such as between about 1 Torr and about 120 Torr. The pedestal temperature may be controlled at about 0 degrees Celsius and about 760 degrees Celsius. The substrate may be exposed to the water vapor plasma for between about 1 second and about 3600 seconds.

In one embodiment, it is contemplated that the plasma of operations 302-306 can be a capacitively coupled or inductively coupled in addition to or as an alternative to a remotely generated plasma. For example, it is contemplated that a capacitively coupled plasma may be generated from water vapor and an inert gas acting as a carrier gas such as He or Ar. The inert gas can also act to suppress condensation. The water vapor may be introduced to the chamber at a flow rate between about 4 SLM and 40 SLM, such as about 9 SLM. The inert gas, such as Ar or He, may be provided to the chamber at a flow rate of between about 1000 sccm and about 20000 sccm, such as about 6000 sccm. In another embodiment, it is contemplated that the water vapor may be generated via in situ steam generation as needed.

When generating a capacitively coupled water vapor plasma, the spacing between the pedestal 204 and showerhead 212 located within the chamber may be within a range of about 20 mils (0.5 mm) to about 45000 mils (1143 mm). Reduced spacing between the substrate is beneficial as spacing facilitates plasma sustainability and density leading to faster etch rates.

In operation 302, water vapor is produced by a water vapor generator (WVG) system 291 and is provided to the process chamber through gas inlet 214 and showerhead 212 (or directly into the chamber) where the water vapor is ignited into a plasma that is primarily formed in the space between the showerhead 212 and the pedestal 204 to etch a boron-carbon film found in region $R_1$ on the surface of showerhead 212 and region $R_2$ on the top surface of the shadow ring 207. The water vapor is introduced to processing chamber 200 at a flow rate of about 9 SLM to about 25 SLM, such as about 18 SLM. The spacing between the showerhead and the pedestal in operation 302 is set at between about 150 mils (3.8 mm) to about 250 mils (6.35 mm), such as about 200 mils (5 mm). The pressure in the chamber is maintained at about 1 Torr to about 120 Torr, such as about 75 Torr. RF power within a range of about 1000 watts to 3,000 watts, such as 2,700 watts is applied to the showerhead 212 for about 240 seconds to generate a plasma containing water vapor to form oxygen, hydrogen, and hydroxyl ions or radicals, which react with the boron-carbon film on the showerhead 212 and top of shadow ring 207 to form volatile compounds which are exhausted from the chamber. The spacing formed between the showerhead and the pedestal in this operation is useful to maintain the water vapor plasma, due to the oxygen, hydrogen and/or hydroxyl components or radicals found in the water vapor containing plasma recombining at a very high rate. The recombination of these components needs to be minimized, since they are the reactive species that etch the boron-carbon residual layer. In one example, the showerhead to pedestal spacing may be about 200 mils (5 mm) for a 300 mm substrate support and showerhead to minimize the recombination of the water vapor components. PPM electrode 208 and bottom tuning electrode 222 need not be biased at this time so the RF power to the showerhead directs the plasma profile in regions $R_1$ and $R_2$ to etch the boron-carbon layer from the surface of the showerhead 212 and the shadow ring 207.

In operation 304, the water vapor plasma density profile is modified to clean boron-carbon deposition region $R_3$ and/or $R_4$ which includes the sides and bottom of shadow ring 207 and the side edges and bottom of the pedestal and/or chamber walls. The water vapor flow rate may be maintained at the same flow rate as in operation 302, such as about 18 SLM. The chamber pressure may also be maintained at the same pressure as in operation 302, such as at about 75 Torr, but the spacing between the showerhead and the pedestal is increased to between 250 mils (6.35 mm) and 450 mils (11.4 mm), such as about 300 mils (7.62 mm). Due to the need for the increased spacing between the showerhead and pedestal to provide adequate plasma coverage of regions $R_3$ and/or $R_4$ and including the backside of shadow ring 207, and due to the high recombination rate of active species in water vapor plasma as discussed above, the PPM electrode 208 and bottom tuning electrode 222 are further biased to maintain the necessary RF power to the plasma. It is believed that by adding or increasing the bias applied to the PPM electrode 208, which is coupled to the side wall of the chamber, and/or adding or increasing the bias applied to the bottom tuning electrode 222, the water vapor plasma can be extended to cover the shadow ring's side and bottom surfaces and the pedestal's side and bottom surfaces, as depicted in region $R_3$. In one example, the PPM electrode 208A or 208B can be biased at between 1 amp and 30 amps, such as 14 amps. Bottom tuning electrode 222 located in the pedestal 204 is also biased at between 1 amp and 30 amps, such as 12 amps. The PPM electrode 208 is biased at a slightly higher power level than the bottom tuning electrode 222 to expand the plasma volume outwards towards the chamber walls. The bottom tuning electrode 222, can be biased at a lower power level than the PPM electrode 208, so as to draw the plasma profile down and around the pedestal and the shadow ring contained thereon. In one example, the PPM electrode 208 and bottom tuning electrode 222 are biased for a period of time in operation 304, and the PPM electrode 208 and bottom tuning electrode 222 are not biased during operation 302. In one configuration, the amount of time the PPM electrode 208 and bottom tuning electrode 222 are biased is based on properties of the boron-carbon film such as the thickness of the deposited layers. It is believed that by biasing the PPM electrode 208 and bottom tuning electrode 222 together with the positioning of the pedestal at a greater distance from the showerhead than what was used in operation 302, will allow the plasma volume/profile to be expanded to enable the plasma, which contains oxygen, hydrogen, and/or hydroxyl ions or radicals, to react with the boron-carbon film found in region $R_3$ to remove these unwanted deposits.

In operation 306, the water vapor plasma profile is modified to clean boron-carbon deposition region $R_4$ which includes the chamber walls of process chamber 100 as shown in FIG. 1. The water vapor flow rate may be maintained at the same flow rate as in operation 304, such as about 9 SLM. The chamber pressure may be reduced to between 5 and 15 Torr, such as about 9 Torr. The spacing between the showerhead and the pedestal is increased from the spacing in operation 304 to between 1000 mils (25.4 mm) and 5000 mils (127 mm), such as about 2000 mils (50.8 mm). PPM electrode 208 is at zero bias or near zero bias and bottom tuning electrode 222 is biased at 50% cap position (effectively neutral position) for a period of time (e.g., 150 seconds). The additional increased spacing between the showerhead and pedestal further expands the plasma profile and enables the plasma containing oxygen, hydrogen, and hydroxyl ions or radicals, to react with the boron-carbon film in region $R_4$. Decreasing the chamber pressure can be advantageously used to maintain the formed plasma as the spacing of the showerhead and pedestal are further increased from a spacing of 300 mils (7.62 mm) in operation 304 to a spacing of 2000 mils (50.8 mm) in the current operation. The tailoring of the bias to PPM electrode 208 and bottom tuning electrode 222, in operation 306, provides a further expanded plasma profile over the plasma profile provided by operations 302 and 304 as discussed above, and targets, etches and removes the boron-carbon layers on the chamber walls that are not otherwise reached with those plasma profiles provided in operations 302 and 304.

As an optional operation, the spacing between the showerhead and the pedestal can be further increased to about 45000 mils (1,143 mm), such as 44000 mils (1117.6 mm). The pressure can be reduced to between 1 Torr and 10 Torr, such as 5 Torr. PPM electrode 208 is at zero bias or near zero bias and bottom tuning electrode 222 is biased at 50% cap position (neutral cap position) for a period of time (e.g., 150 seconds). This operation removes any remaining boron-carbon residue that may have not have reacted with the water vapor plasma as generated in operations 302, 304 and 306.

In addition, while performing the water vapor plasma treatment process at operations 302, 304 and 306, other different gas sources may also be supplied into the process chamber to enhance the reaction efficiency of the cleaning gases. For example, it is contemplated that the water vapor may be generated via in situ steam generation. In another embodiment, it is contemplated that non-stoichiometric combinations of oxygen and hydrogen (e.g., $H_xO_y$, where x and y may be integers or non-integers both greater than zero) may be input to or generated by the WVG. In such an embodiment, some hydrogen peroxide may be generated by the water vapor generator. In another embodiment, in addition to He and Ar used as carrier gases, it is contemplated that oxygen gas, nitrogen gas, nitrous oxide gas, and/or hydrogen gas may be provided to the processing chamber in addition to water vapor. In such an embodiment, the addition of hydrogen has been found to increase the removal rate of the boron-carbon residue, especially in boron-carbon films containing a higher concentration of boron as compared to carbon. Carrier gases, such as helium, have been observed to lower the rate of removal of the boron-carbon film, while simultaneously improving etch uniformity. In another embodiment, it is contemplated that the water vapor may be used to strip a carbon film, such as amorphous carbon, containing substantially no boron. Alternatively, it is contemplated that the water vapor may be used to strip a boron film, such as amorphous boron, containing substantially no carbon.

In operations 302, 304 and 306, an oxygen containing gas may also be supplied with the water vapor into the process chamber to perform the plasma clean treatment process. The oxygen ions may desirably react with the carbon of the boron-carbon film to form a volatile compound (e.g., $CO_2$) which is eventually exhausted from the processing chamber. It is contemplated that any compound which provides oxygen, such as $O_2$, $N_2O$, $CO_2$, NO, or $NO_2$, may be used and supplied with the water vapor to perform the boron-carbon residue film removal process. In operations 302, 304 and 306, a hydrogen containing gas may also be supplied with the water vapor into the process chamber to perform the plasma treatment process. The hydrogen-containing compound may preferentially react with the boron in the boron-carbon film to form a volatile mixture (e.g., $B_2H_6$) which is then exhausted from the chamber. It is contemplated that any compound which provides hydrogen, such as $H_2$, $NH_3$ or $H_2O_2$ may be supplied with the water vapor to perform the boron-carbon residue film removal process.

In another embodiment, it is contemplated that a fluorine-containing gas or a chlorine-containing gas may be ionized in combination with the water vapor or the water vapor may be combined with a fluorine or chlorine to increase the etching rate of the boron-carbon film. The fluorine-containing gas or the chlorine-containing gas is generally provided to the chamber at a minimal flow rate between about 50 sccm and 150 sccm, such as about 100 sccm, enough of a flow rate to enhance the etch rate of the water vapor plasma, but not enough of a flow rate that the fluorine or chlorine would negatively react with the aluminum components within the processing chamber.

Figure 4:
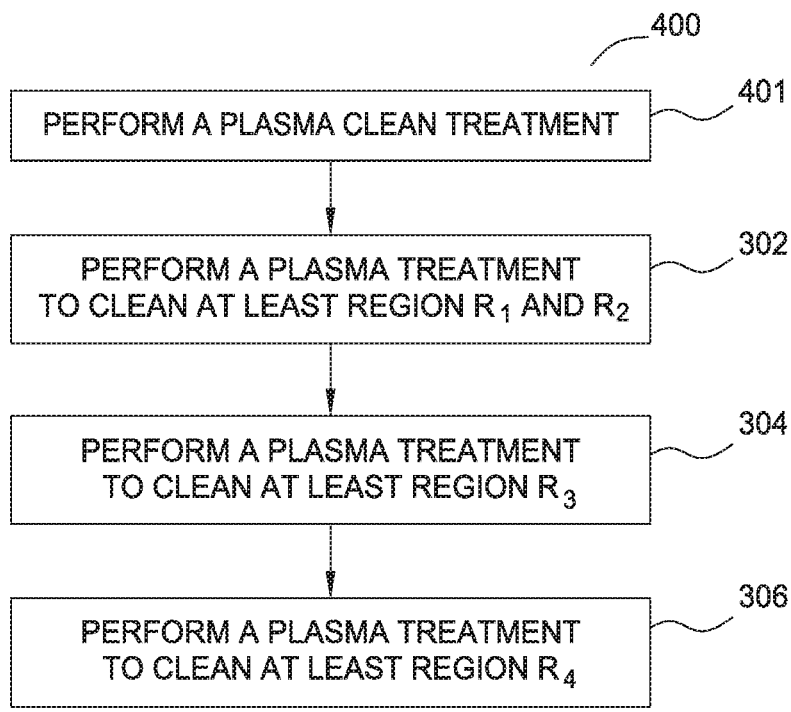
FIG. 4 depicts a flow process diagram of another cleaning process according to one embodiment of the present invention.

FIG. 4 is a flow diagram 400 illustrating another method of removing a boron-carbon residual film using plasma generated from water vapor according to one embodiment of the invention. Flow diagram 400 includes the same operations 302, 304, and 306 from flow diagram 300 which are discussed above. However, diagram 400 includes operation 401 which precedes operations 302-306 and provides an $O_2$ plasma pre-clean step to regions $R_1$, $R_2$, $R_3$ and $R_4$. The build-up of boron-carbon process residuals on the processing volume side of the showerhead, chamber walls, shadow ring, pedestal edge and backside of the pedestal can be cleaned with the aid of an added $O_2$ pre-clean operation. The $O_2$ plasma clean with RF power of at least 500 W and an $O_2$ flow rate of 1 SLM to 15 SLM, such as 7 SLM, spreads easily within the chamber and the oxygen ions react with, and effectively remove carbon from the boron-carbon residual film and break down the film. The removal of the carbon from the boron-carbon residual film enhances the etch performance of the subsequent water vapor plasma making it easier to strip the rest of the residuals from the chamber walls, shadow ring and pedestal. It is also believed that the $O_2$ plasma pre-clean operation is also effective as a final chamber clean step, or post-water vapor plasma clean process step subsequent to the water vapor plasma clean operations 302, 304 and 306. In other embodiments, the $O_2$ plasma pre-clean operation may be used before and/or after any one or more of the water vapor plasma clean operations 302, 304 and 306.

In one example for removing a boron-carbon residual film, such as shown in FIG. 4, the $O_2$ plasma pre-clean step (operation 401), includes delivering $O_2$ at a flow rate in a range between about 10 SLM and 20 SLM, such as a flow rate of about 14 SLM, and setting the spacing between showerhead 212 and pedestal 204 between about 250 mils (6.35 mm) and 450 mils (11.4 mm), such as about 400 mils (10.16 mm). During this step, the pressure in the chamber 200 is set between 1 Torr and 20 Torr such as about 9 Torr. RF power is applied to the showerhead 212 at between about 1000 watts and 1600 watts, such as 1300 watts, for a period of time between 240 seconds and 600 seconds, such as 360 seconds, to provide an oxygen plasma to break down the boron-carbon residual film.

After the initial $O_2$ plasma pre-clean operation, the process parameters are modified to achieve operation 302, which targets the removal of the boron-carbon residual film from regions $R_1$ and $R_2$, the bottom surface of showerhead 212 and the top surface of the shadow ring 207. During this step, the spacing between showerhead 212 and pedestal 204 is readjusted to a spacing of between about 150 mils (3.8 mm) and about 250 mils (6.35 mm), such as about 200 mils (5 mm). This reduced spacing between the showerhead 212 and the pedestal 204 focuses the cleaning plasma on the showerhead 212 and the top surface of the shadow ring 207. During this step, the pressure in the chamber 200 is provided at about 75 Torr and water vapor is introduced into the chamber 200 at a rate of between about 9 SLM and 25 SLM, such as 18 SLM. An RF power between about 1000 watts and 3000 watts, such as about 2700 watts is then applied to the showerhead 212 for about 360 seconds to remove the boron-carbon residual film from the showerhead 212 and the top of the focus ring 207.

Next, to expand the plasma cleaning profile to remove the boron-carbon residual film from region $R_3$, the sides and bottom of the shadow ring 207 and the pedestal 204, as described previously with reference to operation 304, the spacing between the showerhead 212 and the pedestal 204 is increased to between 250 mils (6.35 mm) and 450 mils (11.4 mm), such as about 300 mils (7.62 mm), and a current of between 1 amp and 30 amps, such as 14 amps, is applied to the PPM electrode 208 while a current between about 1 amp and 30 amps, such as a current of 13 amps, is applied to the bottom tuning electrode 222 for about 540 seconds. During operation 304, the pressure in the chamber 200 is maintained at 75 Torr, a water vapor flow is provided at 18 SLM and a RF power of about 2700 watts is provided to the showerhead 212.

Next, to expand the cleaning plasma profile to remove boron-carbon residual film from region $R_4$, the chamber walls, as described previously with reference to operation 306, the spacing between showerhead 212 and pedestal 204 is further increased to between about 1000 mils (25.4 mm) and about 5000 mils (127 mm), such as about 2000 mils (50.8 mm), while a water vapor is provided at a flow rate of about 18 SLM. The pressure in chamber 200 is provided at about 9 Torr and an RF power of about 2500 watts is provided to the showerhead 212. During this step, the PPM electrode 208 is maintained at a zero bias or near zero bias, and the bottom tuning electrode 222 is biased using a 50% cap position (neutral cap position) for a period of 225 seconds, which allows further expansion of the cleaning plasma to remove the boron-carbon residual film from the chamber walls. To remove any remaining boron-carbon residue within the chamber, the cleaning plasma is further expanded by increasing the spacing between showerhead 212 and pedestal 204 to about 45000 mils (1,143 mm), such as 43800 mils (1112.52 mm), while a water vapor is provided at a flow rate of about 18 SLM. During this step, the pressure in chamber 200 is further maintained at a pressure of about 5 Torr and an RF power of about 2500 watts is provided to the showerhead 212. During this step, the PPM electrode 208 is maintained at a zero bias or near zero bias, and the bottom tuning electrode 222 is biased using a 50% cap position (neutral cap position) for a period to about 225 seconds to facilitate the removal of any remaining boron-carbon residual film that was not otherwise removed during operations 302, 304 and 306.

While the foregoing is directed to embodiments of the present invention, other and further embodiments of the invention may be devised without departing from the basic scope thereof, and the scope thereof is determined by the claims that follow.

We claim:

1. A method for removing a boron-carbon layer from a surface of a processing chamber, comprising:
   exposing a deposited boron-carbon layer to a first plasma process to remove residual layers formed on a surface of the process chamber, wherein the first plasma process comprises:
     positioning a pedestal at a first distance from a showerhead, wherein the pedestal comprises a substrate support surface, a side surface and a bottom surface, and the side surface is disposed between the bottom surface and the substrate supporting surface;
     generating a plasma that comprises water vapor and a first carrier gas by biasing the showerhead that is disposed over the positioned pedestal; and
   exposing the deposited boron-carbon layer to a second plasma process to remove residual layers formed on a surface of the process chamber, wherein the second plasma process comprises:
     positioning the pedestal at a second distance from the showerhead;
     generating a plasma that comprises water vapor and a second carrier gas by biasing the showerhead; and
     biasing a side electrode relative to the showerhead, wherein biasing the side electrode causes the plasma generated during the second plasma process to form around the side surface and the bottom surface of the pedestal to remove the residual boron carbon layer therefrom, wherein the side electrode is positioned adjacent a chamber wall and a distance from the chamber lid, and wherein the processing chamber further comprises an upper side electrode disposed adjacent to a processing volume defined between the substrate supporting surface, a chamber wall and a chamber lid assembly.

2. The method of claim 1, further comprising:
   exposing the deposited boron-carbon layer to a third plasma process at a reduced chamber pressure, wherein the reduced chamber pressure is less than the chamber pressure during the first and second plasma processes, and wherein the third plasma process comprises positioning the pedestal at a third distance from the showerhead and generating a plasma that comprises water vapor and a third carrier gas by biasing the showerhead and biasing a bottom electrode relative to the showerhead.

3. The method of claim 2, further comprising:
exposing the deposited boron-carbon layer to a fourth plasma process, wherein the fourth plasma process comprises generating a plasma that essentially consists of oxygen and a fourth carrier gas by biasing the showerhead that is disposed over a pedestal.

4. The method of claim 3, wherein the exposing the deposited boron-carbon layer to the fourth plasma process is provided between one or more of the first plasma process and second plasma process and the second plasma process and the third plasma process.

5. The method of claim 1, wherein generating the second plasma comprises biasing a bottom electrode relative to the showerhead.

6. The method of claim 1, wherein the water vapor is generated by a liquid evaporator.

7. The method of claim 6, wherein the liquid evaporator comprises heating units to vaporize the water at high flow rates of 10 SLM or greater.

8. A method for removing a boron-carbon film from a surface of a chamber component within a processing chamber, comprising:
exposing a deposited residual boron-carbon film on the surface of the chamber component within the processing chamber to a first plasma process to remove the residual boron-carbon film on a top surface of the chamber component, wherein the first plasma process comprises:
positioning a pedestal at a first distance from a showerhead;
generating a first plasma that comprises water vapor and a first carrier gas by biasing the showerhead that is disposed over the positioned pedestal; and
exposing the deposited residual boron-carbon film to a second plasma process to remove the residual boron-carbon film on the surface of the chamber component, wherein the second plasma process comprises:
positioning the pedestal at a second distance from the showerhead; and
generating a second plasma that comprises water vapor and a second carrier gas by biasing the showerhead and biasing a side electrode relative to the showerhead causing the plasma to be generated in a different region of the plasma processing chamber to remove the residual boron-carbon film from the chamber component, wherein the side electrode is a first side electrode disposed adjacent a processing volume between a chamber wall and a chamber lid assembly and a second side electrode is positioned adjacent a chamber wall and a distance below the first side electrode.

9. The method of claim 8, further comprising:
exposing the deposited boron-carbon film to a third plasma process, wherein the third plasma process comprises positioning the pedestal at a third distance from the showerhead and generating a plasma that comprises water vapor and a third carrier gas by biasing the showerhead and biasing a bottom electrode relative to the showerhead.

10. The method of claim 9, further comprising:
exposing the deposited boron-carbon film to a fourth plasma process, wherein the fourth plasma process comprises generating a plasma that essentially consists of oxygen and a fourth carrier gas by biasing the showerhead that is disposed over a pedestal.

11. The method of claim 10, wherein the exposing the deposited boron-carbon film to the fourth plasma process is provided between one or more of the first plasma process and second plasma process and the second plasma process and the third plasma process.

12. The method of claim 8, wherein generating the second plasma comprises biasing a bottom electrode relative to the showerhead.

13. The method of claim 8, wherein the water vapor is generated by a liquid evaporator.

14. The method of claim 13, wherein the liquid evaporator comprises heating units to vaporize the water at high flow rates of 10 SLM or greater.

15. A method for removing a film from a surface of a chamber component within a processing chamber, comprising:
exposing a deposited residual boron-carbon film on a surface of the chamber component within the processing chamber to a first plasma process to remove the residual boron-carbon film formed on a top surface of the chamber component, wherein the first plasma process comprises:
positioning a pedestal at a first distance from a showerhead;
generating a first plasma that comprises water vapor and a first carrier gas by biasing the showerhead that is disposed over the positioned pedestal; and
exposing the deposited residual boron-carbon film to a second plasma process to remove the residual boron-carbon film formed on the surface of the chamber component, wherein the second plasma process comprises:
positioning the pedestal at a second distance from the showerhead; and
generating a second plasma at a reduced chamber pressure that comprises water vapor and a second carrier gas by biasing the showerhead, biasing a bottom electrode and biasing a side electrode relative to the showerhead causing the plasma generated during the second plasma process to form around a side surface and a bottom surface of the chamber component to remove the residual boron-carbon film therefrom, wherein the reduced chamber pressure is less than the chamber pressure during the first plasma process, and wherein the side electrode is a first side electrode disposed adjacent a processing volume between a chamber wall and a chamber lid assembly and a second side electrode is positioned adjacent a chamber wall and a distance below the first side electrode.

16. The method of claim 15, wherein the biasing of the side electrode causes a higher current to flow through the side electrode versus the current flow through the bottom electrode.

17. The method of claim 15, wherein the biasing of the side electrode causes a lower current to flow through the side electrode versus the current flow through the bottom electrode.

18. The method of claim 15, wherein the positioning of the pedestal at a second distance is at a greater distance from the showerhead than the first distance.

19. The method of claim 15, wherein an amount of time the side electrode and the bottom electrode are biased is based on properties of the boron-carbon film.

20. The method of claim 15, wherein the side electrode and the bottom electrode are biased for a period of time during the exposing the deposited boron-carbon film to the second plasma process.

21. The method of claim 2, wherein the reduced chamber pressure is between 5 Torr and 15 Torr.

22. The method of claim 5, wherein the biasing of the side electrode causes a higher current to flow through the side electrode versus the current flow through the bottom electrode.

23. The method of claim 8, wherein the second plasma is at a lower chamber pressure than a chamber pressure of the first plasma, the lower chamber pressure is between 5 Torr and 15 Torr.

24. The method of claim 12, wherein the biasing of the side electrode causes a higher current to flow through the side electrode versus the current flow through the bottom electrode.

25. The method of claim 15, wherein the reduced chamber pressure is between 5 Torr and 15 Torr.

\* \* \* \* \*